United States Patent [19]

Soliday

[11] Patent Number: 5,041,699
[45] Date of Patent: Aug. 20, 1991

[54] LAMINATED THERMALLY CONDUCTIVE SUBSTRATE
[75] Inventor: John L. Soliday, Hanover Park, Ill.
[73] Assignee: Motorola, Inc., Schaumburg, Ill.
[21] Appl. No.: 530,956
[22] Filed: May 29, 1990
[51] Int. Cl.[5] .............................................. H05K 1/00
[52] U.S. Cl. .................................. 174/255; 174/256; 361/401; 428/901
[58] Field of Search ....................... 174/252, 255, 256; 361/401; 428/901

[56] References Cited
U.S. PATENT DOCUMENTS 4,609,586  9/1986  Jensen et al. ........................ 428/901
4,876,120  10/1989  Belke et al. ......................... 174/256
4,914,551  4/1990  Anschel et al. ...................... 361/389

OTHER PUBLICATIONS

"Thick Metal Cladding on RT/duroid Microwave Circuit Dielectric Laminates", by Rogers Corporation, RT 5.3.2. 8/87, pp. 1–6.

Primary Examiner—Leo P. Picard
Assistant Examiner—Trinidad Korka
Attorney, Agent, or Firm—Val Jean F. Hillman

[57] ABSTRACT

The present invention discloses a laminated thermally conductive substrate for supporting microwave power amplifiers, having unique layering thicknesses with materials having similar thermal expansion characteristics, whereby the thermally conductive substrate experiences limited deflection during temperature cycling.

28 Claims, 2 Drawing Sheets

5,041,699

LAMINATED THERMALLY CONDUCTIVE SUBSTRATE

TECHNICAL FIELD

The present invention relates to laminated substrates and more particularly to a laminate substrate having an integral heat sink. Specifically, however, this invention relates to the development of a laminated thermally conductive substrate that experiences limited temperature induced deflection.

BACKGROUND OF THE INVENTION

Laminated substrates having a heat sink are known in the art. Typically, these devices are utilized where the application of high power requires dissipating the heat generated by active components, conductor resistance losses, and dielectric losses. One such high power application is the field of microwave power amplifiers.

Prior art microwave power amplifiers are traditionally based on modules comprising an aluminum carrier plate, upon which discrete alumina substrates are selectively bonded. Thereafter, metal-cladding techniques are employed to bond thin conductive strips to the substrate for providing electrical interconnection between the discrete components, including the power transistors, which comprise the power amplifier design. Through-holes in the alumina substrate and the aluminum carrier plate allow the transistors to be thermally connected to the module's heat sink. Each prescreened (with solder paste) module is then positioned on a spring loaded carriage or fixture, designed to provide a clamping force upon the individual components as the fixture travels through a reflow oven where the solder is reflowed.

There are two particular problems with the prior art devices. First is the poor adhesion between the ceramic (alumina) substrate and the metallic (aluminum) carrier plate. Second is the intolerable mismatch between the coefficients of thermal expansion (CTE) of alumina, aluminum, and the thin conductive strips. These problems typically surface during module temperature cycling, when the differing rates of thermal expansion between alumina, aluminum, and the conductive strips cause residual strains to develop in the adhering bonds between the differing materials. The resultant forces are primarily responsible for the broken components, compromised solder joints, and over stressed device leads experienced by prior art power amplifier modules.

In response, the industry has turned to laminated thermally conductive circuit boards as a possible solution. While these devices have gained increased acceptance for overcoming many of the interconnect problems associated with the alumina substrate modules, they nonetheless suffer from shortcomings of their own. For example, extreme thermal shock or temperature cycling can cause cracks in the conductive strips on a laminate circuit board when the CTE mismatch between the thermally conductive material and the dielectric material is unaccounted for.

Yet another concern is etch shrink, the X,Y dimensional change when metallic foil is etched to produce circuit board conductive strips. Because of CTE mismatches between the thermally conductive material and the dielectric material presently employed in metal clad laminates, internal strains develop in the laminate as it cools down after the process of heat bonding metal foil to the dielectric substrate. When the foil is subsequently etched to produce circuit board conductive strips, the internal strain often causes uncontrolled dimensional changes in the conductive strip patterns, thereby rendering several laminates unusable.

In addition, the CTE mismatch between the thermally conductive material and the dielectric material will cause the laminate to bend uncontrollably under the temperatures associated with most soldering processes. While the laminate may resume its original shape after cooling, the temperature induced contortions nonetheless cause residual stresses to develop in surface mount device leads and solder joints. This stress promotes the breaking of device leads and the rapid degradation of solder joints. Accordingly, the temperature induced deflection experienced by prior art laminates may result in compromised circuit board performance.

One industry solution suggests providing a thick metal ground plane for the laminate circuit board. See "Thick-Metal Cladding On RT/duroid Microwave Circuit Dielectric Laminates," Rogers Corporation., Microwave Materials Division, August 1987, 100 S. Roosevelt Ave, Chandler, AZ 85226. According to this method, the thick metal layer must be at least three times the dielectric thickness for soft metals like aluminum and copper, and two times the dielectric thickness for alloys such as brass or stainless steel. Not surprisingly, the stiffness of the thick metal layer, if thick enough, will dominate the composite effect of the laminate CTE mismatch and prevent the laminate from bending during temperature cycling. The reality is that metal clad laminates with heat sinks two and three times the thickness of the dielectric substrate are simply impracticable in many applications.

The average power transistor used in a Radio Frequency (RF) power amplifier requires a dielectric layer of at least $0.041 \pm 0.005$ inches thick in order to assure proper solder contact of device leads. According to thick metal cladding techniques, however, a thermally conductive layer of 0.08 or 0.12 inches will be required to assure that the laminate does not warp under temperature. These dimensions suggest a device whose total thickness is somewhere in the neiqhborhood of 0.12 to 0.16 inches. The modern trend in thick metal cladding, however, is moving away from the specialized requirements associated with the assembly of such hybrid devices towards uniformity.

The typical printed circuit board (PCB) utilized in digital, audio, low frequency, and other applications is approximately $0.062 \pm 0.005$ inches in thickness. The desire is to develop a metal clad laminate that rivals standard PCBs in fit and form in order to take advantage of the reduced costs associated with production in the standard PCB environment. It would be extremely advantageous therefore to provide a laminated thermally conductive substrate that conforms to PCB industry standards, and experiences minimal deflection during temperature cycling.

SUMMARY OF THE INVENTION

Accordingly, a general object of the present invention is to provide a laminated thermally conductive substrate.

Another object of the present invention is to provide a laminated thermally conductive substrate possessing a controlled deflection under the temperature associated with solder reflowing and other bonding processes.

Yet another object of the present invention is to provide a laminated thermally conductive substrate that is compatible with current PCB manufacturing techniques.

A further object of the present invention is to provide a laminated thermally conductive substrate that is capable of supporting a microwave power amplifier.

These and other objects are achieved by the present invention which, briefly described, is a laminated thermally conductive substrate. According to the present invention this substrate contains a conductive means for conducting heat away from electronic components. Typically, this will be a layer of metallic material like copper, aluminum, brass, Kovar, Invar, or stainless steel. Next is a layer of surface material having conductive strips which permit the electrical interconnection of the electrical components. Finally, disposed between the conductive means and the layer of surface material is an insulating means that electrically insulates the conductive means from various surface features, for example, conductive strips. According to the present invention, this insulating means can be any of the various families of dielectric epoxies presently utilized in PCB design and manufacture. Of importance, the surface material and the conductive means are selected based upon their coefficients of thermal expansion (CTE). The desire is to match the surface material CTE with the conductive means CTE such that they are more similar than they are dissimilar. In this way, they will respond similarly to the effects of temperature.

DETAILED DESCRIPTION OF THE PREFERRED EMBODIMENT

Figure 1:
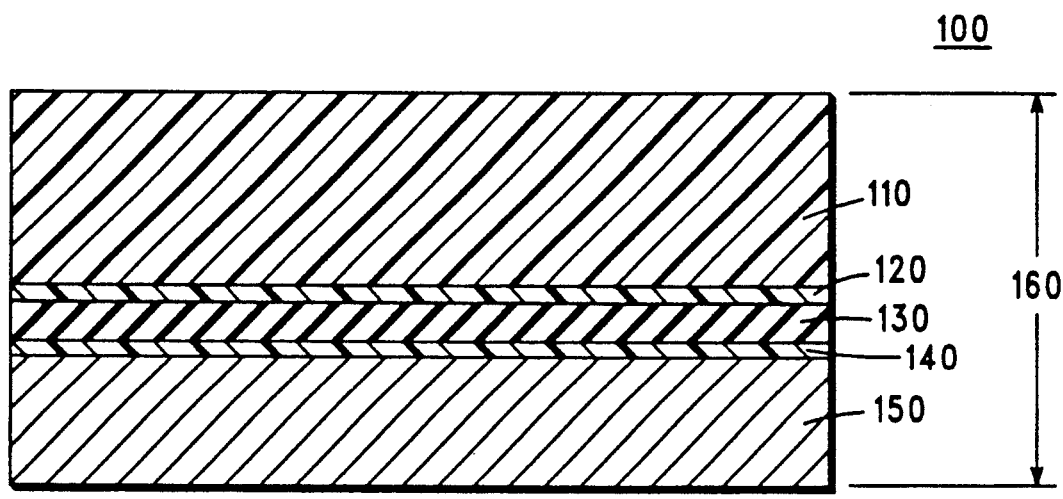
FIG. 1 is a side view of the laminated thermally conductive substrate according to the present invention.

A principal application of the present invention is for a laminated thermally conductive substrate, designed to support an RF/microwave power amplifier. The preferred embodiment is shown generally as 100 in FIG. 1, which is a side view of the laminate substrate according to the present invention. This side view shows the various layers employed in the development of the substrate.

Starting with the thermally conductive layer 150, which provides both a sturdy base and heat transfer medium, a first thin 0.0025 inch layer of low flow pre-preg epoxy 140 is deposited thereon in order to bond the thermally conductive layer 150 to the remainder of the laminate. According to the preferred embodiment, the thermally conductive layer 150 is a 0.020 inch thick copper sheet. Copper was selected because of its heralded thermal conductive properties. The 0.020 inch dimension was selected because 0.020 inches is a standard size for flat sheets of copper which require no additional flattening in order to be utilized in the present invention. The thermally conductive layer 150 is employed to dissipate the heat generated by electronic components employed in the RF power amplifier design. While copper is but one alternative, it will be appreciated by those skilled in the art that thermally conductive layer 150 may comprise any number of thermal conductors, including but not limited to: aluminum, brass, Kovar, Invar, or stainless steel. The low flow pre-preg epoxy layer 140 is of a type typically used in multi-layered PCB designs.

Upon the low flow pre-preg epoxy layer 140 is an insulating layer 130. According to the preferred embodiment this layer comprises 0.005 inches of FR4/G10 glass filled epoxy. Its primary purpose is to electrically insulate the conductive layer 150 from the remainder of the laminate structure. Accordingly, insulating layer 130 may comprise any of the well known glass filled insulating epoxies employed in the PCB art. The second function of the insulating layer 130 is to add to the stack up height of the laminate above the thermally conductive layer 150. In this way, the laminate can be designed to comply with the fixturing requirements which dictate that the optimum total laminate thickness should not exceed 0.062±0.005 inches, the standard thickness of a conventional PCB. By following this design criteria, the thermally conductive substrate of the present invention will benefit from the reduced costs associated with production in the standard PCB environment.

Disposed upon the insulating layer is a second 0.0025 inch layer of low flow pre-preg epoxy 120. Like the first layer of low flow pre-preg epoxy 140, the second layer 120 is a low flow pre-preg epoxy like those typically used in PCB designs. According to FIG. 1, it is deposited upon the insulating layer 130 in order to bond the insulating layer 130 and the thermally conductive layer 150 to the remainder of the laminate. In addition, both the first and second layers of low flow pre-preg epoxy add to the stack up height of the overall laminate thickness.

Finally, disposed upon the second layer of low flow pre-preg epoxy 120 is a 0.031 inch layer of circuitized surface material 110. By circuitized it is meant that conductive strips are disposed upon at least one surface of the surface material 110. According to the preferred embodiment, the layer of surface material 110 is made of bismaleimide triazine epoxy (BT). The selection of this particular epoxy was based upon the desire to use a surface material 110 possessing a CTE that is substantially similar to that of the thermally conductive layer 150. As previously discussed, the thermally conductive layer 150 is copper. Copper has an X,Y CTE of approximately 17.38 E-6 in/in/° C. BT was therefore selected as the surface material for two reasons. First, BT has a glass transition temperature of 195° C. Second, BT has an X,Y CTE of approximately 15 E-6 in/in/° C.

BT's high glass transition temperature is important because it enables BT to withstand the extreme environmental conditions associated with reflow soldering. Of equal importance, however, BT's X,Y CTE is substantially similar to that of the copper conductive layer. The term "substantially similar" or "more similar than not" as used herein means that the CTE of the conductive material and the surface material differ by no more than 5 parts per million (PPM)/degree Celsius. Maintaining this relationship will restrict the temperature induced deflection experienced by the substrate to an amount no more than about five percent (5%) of the overall substrate length. Thus, the substantially similar CTE's of the thermally conductive layer 150 and the layer of surface material 110 provide a means of controlling the amount of deflection the laminate will experience while under the temperature and pressure associated with reflow soldering and other bonding processes. The CTE of the insulating layer 130 and layers of low flow pre-preg epoxy 120 and 140 is of little concern. As long as the CTE of the thermally conductive layer 150 and the layer of surface material 110 are more similar than not, the thermally conductive material and the surface material will respond similarly to the effects of temperature, and the substrates deflection will remain minimal.

According to this invention, deflection damping is now achievable in a laminate wherein the thermally conductive layer 150 need not be two to three times thicker than the dielectric layer as taught by the prior art. Since substantially similar CTE's will reduce the amount of deflection experienced by the laminate during temperature cycling, it is no longer necessary to rely upon the tensile strength of a thick metal ground plane in order to dominate the composite CTE laminate mismatches. Accordingly, the present invention permits the reduction in thickness of the thermally conductive layer 150, thereby reducing the overall thickness of the substrate 100.

From FIG. 1, dimension 160 is observable. According to the preferred embodiment, the dimension 160 is designed to conform to the standard PCB thickness of approximately 0.062±0.005 inches. While this embodiment discloses a substrate wherein the thermally conductive layer 150 thickness is less than the thickness of the layer of surface material 110, it will be appreciated by those skilled in the art that a substrate having a conductive layer which is equal to or even greater in thickness than the layer of surface material 110 is an alternative to the depicted embodiment which does not depart from the spirit of the disclosed invention.

Figure 2:
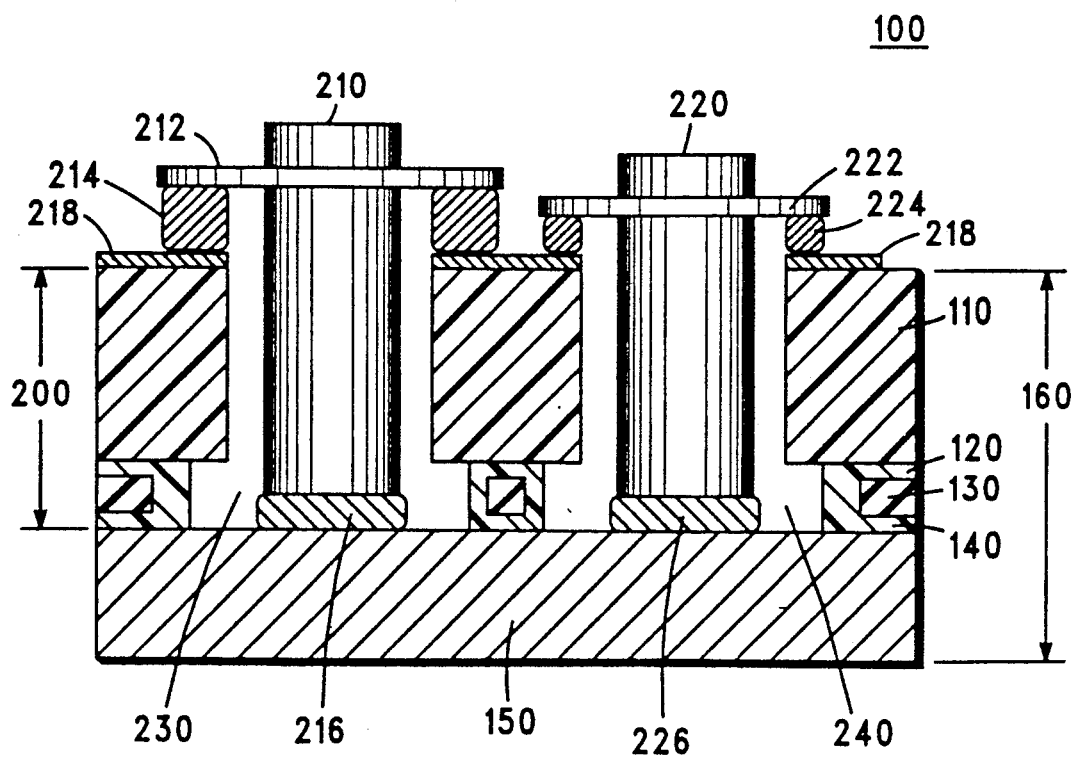
FIG. 2 is a cross sectional view of the laminated thermally conductive substrate according to the present invention.

FIG. 2 reveals a cross sectional view of the thermally conductive substrate according to the present invention. This view depicts the substrate 100, having openings through the layer of surface material 110, the first and second layers of low flow pre-preg epoxy 120 and 140, and the insulating means 130, thereby exposing a portion of the thermally conductive layer 150 for defining wells 230 and 240 for receiving electronic components 210 and 220.

According to the preferred embodiment, the well depth dimension 200 is approximately 0.41±0.005 inches. This dimension was selected in order to provide a laminate stack up height, above the thermally conductive layer 150, that conforms to standard package sizes for both studless and flangeless RF power devices. Typically these devices have depths which range from 0.040 to 0.045 inches.

As shown in FIG. 2, electronic components 210 and 220 have different depths. A component's depth is the distance measured from the contact leads 212 and 222 to the bottom surface of the device package. Despite their differences, electronic components 210 and 220 are fitted within the wells 230 and 240, by simply varying the size of the solder joints 214 and 224. This adjustment, in combination with the selected well depth, acts to reduce the mechanical stress otherwise applied to device leads when the component depth and the well depth dimensions are unequal. Accordingly, the well depth dimension 200 represents a compromise which attempts to match the laminate's stack up height to a potential range of component depths. In this way, electronic components of various dimensions can be soldered to the substrate 100, via solder preforms 216 and 226, which provide thermal coupling to the thermally conductive layer 150, and solder joints 214 and 224, which provide electrical contact to the conductive strips 218.

Figure 3:
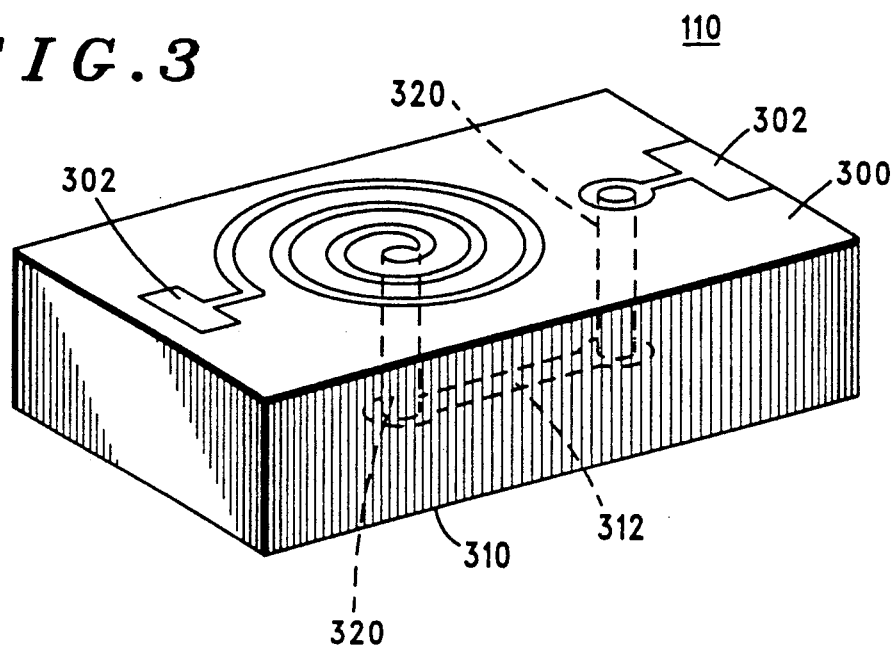
FIG. 3 is an exploded view of a portion of the layer of surface material, having conductive strips on an upper and a lower surface.

FIG. 3 is an exploded view of a portion of the layer of surface material 110, having conductive strips 302 on an upper surface 300, and conductive strips 312 on a lower surface 310. In conjunction with the thru-holes 320 which provide electrical contact therebetween, conductive strips 302 and 312 define an inductor. Because this component utilizes conductive strips 312 on the lower surface 310 of surface material 110, the present invention discloses insulating material between the surface material 110 and the thermally conductive layer 150. As previously discussed, the insulating layer 130 has the primary purpose of electrically insulating the thermally conductive layer 150 from the remainder of the laminate structure. In ID particular, however's, the insulating layer 130 is employed to provide a dielectric barrier between the conductive strips 312 and the thermally conductive layer 150. In this way, shunt components can be integrated into the multi-layered substrate design, thereby avoiding the need for actual discrete hardware. These space saving measures equate to a reduction in the substrate's overall size and cost.

Figure 4:
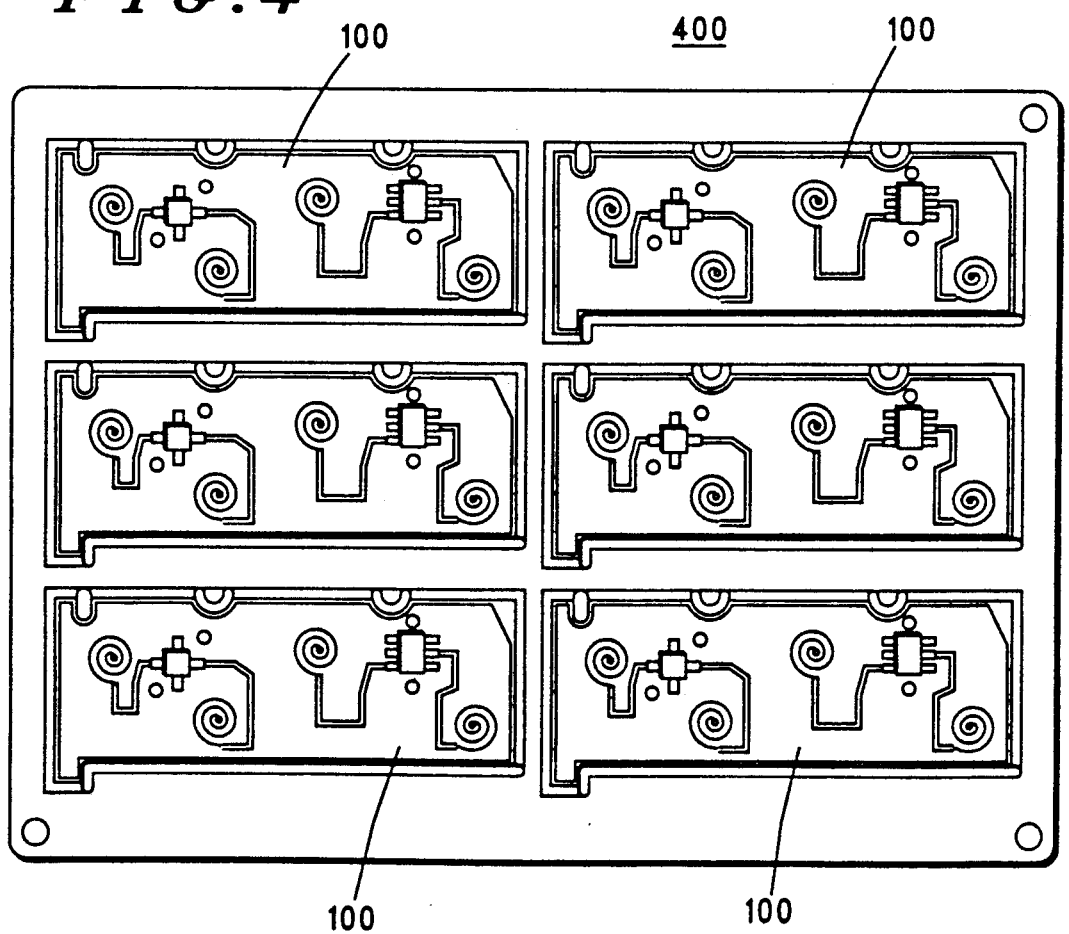
FIG. 4 is a top view of a divisible laminate comprising a plurality of multi-layered printed circuit boards according to the present invention.

FIG. 4 is a top view of a divisible laminate 400 comprising a plurality of thermally conductive substrates 100 according to the present invention. Because the laminate 400 is approximately 0.062±0.005 inches thick, it may be assembled utilizing conventional surface mount electronic manufacturing techniques. In addition, since the thermally conductive layer 150 is only 0.020 inches thick, with an overall laminate thickness of 0.062±0.005 inches, the individual substrates 100 may be sheared or broken away from the laminate 400 as are standard PCB's. Accordingly, the present invention discloses a method of producing multiple thermally conductive substrates capable of supporting RF/microwave power amplifiers, which avoid the specialized handling requirements associated with the prior art.

In summary, the present invention discloses a laminated thermally conductive substrate 100 having unique layering thicknesses 160 and 200 with materials having substantially similar thermal expansion characteristics, whereby the substrate 100, under the temperature associated with solder reflowing, soldering, or other bonding processes, experiences limited deflection. While a particular embodiment of the invention has been shown and described herein, it will be obvious that additional modifications may be made without departing from the spirit of this disclosure.

What is claimed is:

1. A laminated thermally conductive substrate comprising:
    conductive means, having a coefficient of thermal expansion, for conducting heat away from electronic components;
    a layer of surface material, having a coefficient of thermal expansion, for providing electrical interconnection between electrical components; and
    an insulating means, disposed between the conductive means and the layer of surface material, for electrically insulating the conductive means from the electrical interconnections,
    wherein the surface material coefficient of thermal expansion and the conductive means coefficient of thermal expansion are substantially similar.

2. The laminated thermally conductive substrate according to claim 1 wherein the surface material coefficient of thermal expansion and the conductive means coefficient of thermal expansion permit the substrate to deflect no more than about 5% of the substrate's length under soldering temperatures.

3. The laminated thermally conductive substrate according to claim 1 wherein the surface material coefficient of thermal expansion and the conductive means coefficient of thermal expansion differ by not more than 5 ppm/degree Celsius.

4. A laminated thermally conductive substrate comprising:
   conductive means, having a coefficient of thermal expansion, for conducting heat away from electronic components;
   a layer of surface material, having a coefficient of thermal expansion substantially similar to that of the conductive means, for providing electrical interconnecting between electrical components; and
   an insulating means, disposed between the conductive means and the layer of surface material, for electrically insulating the conductive means from the electrical interconnections,
   wherein the surface material coefficient of thermal expansion and the conductive means coefficient of thermal expansion differ by not more than 5 ppm/degree Celsius, thereby permitting the substrate, under soldering temperatures, to deflect not more than about 5% of the substrate's length.

5. The laminated thermally conductive substrate according to claim 4 wherein the surface material comprises a dielectric epoxy.

6. The laminated thermally conductive substrate according to claim 4 wherein the surface material has conductive strips on at least one surface thereof.

7. The laminated thermally conductive substrate according to claim 4 wherein the conductive means is a metallic material.

8. The laminated thermally conductive substrate according to claim 4 wherein the insulating means comprises a dielectric epoxy.

9. The laminated thermally conductive substrate according to claim 5 having an opening through the layer of surface material and the insulating means, thereby exposing a portion of the conductive means and defining a well for receiving an electronic component.

10. The laminated thermally conductive substrate according to claim 4 wherein the conductive means thickness is less than or equal to the thickness of the surface material.

11. The laminated thermally conductive substrate according to claim 4 is a printed circuit board.

12. The printed circuit board according to claim 11 is formed and partitioned from a divisible laminate comprising a plurality of multi-layered printed circuit boards.

13. A laminated thermally conductive substrate comprising:
    conductive means, having a coefficient of thermal expansion, for conducting heat away from electronic components;
    a layer of surface material comprising a dielectric epoxy having a coefficient of thermal expansion substantially similar to that of the conductive means, for providing electrical interconnection between electrical components;
    insulating means, comprising a dielectric epoxy, disposed between the conductive means and the layer of surface material, for electrically insulating the conductive means from the electrical interconnections; and
    adhesive means, for adhering the conductive means tot he insulating means, and adhering the insulating means to the layer of surface material,
    wherein the surface material coefficient of thermal expansion and the conductive means coefficient of thermal expansion differ by not more than 5 ppm/degree Celsius, thereby permitting the substrate, under soldering temperatures, to deflect not more than about 5% of the substrate's length.

14. The laminated thermally conductive substrate according to claim 13 wherein the surface material has conductive strips on at least one surface thereof.

15. The laminated thermally conductive substrate according to claim 13 wherein the conductive means comprises copper.

16. The laminated thermally conductive substrate according to claim 13 wherein the adhesive means comprises a low flow pre-preg epoxy.

17. The laminated thermally conductive substrate according to claim 13 having an opening through the surface material, the insulating means, and the adhesive means thereby exposing a portion of the conductive means and defining a well for receiving an electronic component.

18. The laminated thermally conductive substrate according to claim 13 wherein the conductive means thickness is less than or equal to the thickness of the surface material.

19. The laminated thermally conductive substrate according to claim 13 is a printed circuit board.

20. The printed circuit board according to claim 19 is formed and partitioned from a divisible laminate comprising a plurality of multi-layered printed circuit boards 21. A laminated thermally conductive substrate comprising:
    a copper conductive layer for conducting heat away from electronic components;
    a first layer of low flow pre-preg epoxy deposited upon the copper conductive layer for adhering to the copper;
    a layer of insulating epoxy deposited upon the first layer of low flow pre-preg epoxy for electrically insulating the copper conductive layer from conductive strips;
    a second layer of low flow pre-preg epoxy deposited upon the layer of insulating epoxy for adhering to the insulating epoxy; and
    a surface layer comprising glass filled bismaleimide triazine epoxy, having conductive strips on at least one surface, deposited upon the second layer of low flow pre-preg epoxy for providing electrical interconnection between electrical components.

22. The laminated thermally conductive substrate according to claim 21 wherein the copper conductive layer thickness is less than or equal to the thickness of the layer of bismaleimide triazine epoxy.

23. The laminated thermally conductive substrate according to claim 21 is a printed circuit board.

24. The printed circuit board according to claim 23 is formed and partitioned from a divisible laminate comprising a plurality of multi-layered printed circuit boards 25. A method of constructing a laminated thermally conductive substrate comprising the steps of:

providing a conductive means, having a coefficient of thermal expansion, for conducting heat away from electronic components;

providing a layer of surface material, comprising a dielectric epoxy having a coefficient of thermal expansion substantially similar to that of the conductive means, for providing electrical interconnection between the electrical components;

depositing an insulating means between the conductive means and the layer of surface material for electrically insulating the conductive means from the electrical interconnections, wherein the surface material coefficient of thermal expansion and the conductive means coefficient of thermal expansion differ by not more than 5 ppm/degree Celsius, thereby permitting the substrate, under soldering temperatures, to deflect not more than about 5% of the substrate's length; and separating the multi-layered substrate from a divisible laminate comprising a plurality of multi-layered substrates.

26. The method of constructing a laminated thermally conductive substrate according to claim 25 further comprising the step of:

providing an opening through the surface material and the means for electrically insulating, exposing a portion of the means for conducting heat and defining a well for receiving an electronic component.

27. The method of constructing a laminated thermally conductive substrate according to claim 25 wherein the conductive means thickness is less than or equal to the thickness of the surface material.

28. The method of constructing a laminated thermally conductive substrate according to claim 25 wherein the multi-layered substrate is a printed circuit board.

* * * * *

UNITED STATES PATENT AND TRADEMARK OFFICE
CERTIFICATE OF CORRECTION

PATENT NO. : 5,041,699

DATED : August 20, 1991

INVENTOR(S) : John L. Soliday

It is certified that error appears in the above-identified patent and that said Letters Patent is hereby corrected as shown below:

In Column 8, line 7, please delete "tot he" and replace with --to the--.

Signed and Sealed this

Third Day of November, 1992

*Attest:*

DOUGLAS B. COMER

*Attesting Officer*      *Acting Commissioner of Patents and Trademarks*